United States Patent
Myerchin (10) Patent No.: US 10,208,891 B2
(45) Date of Patent: Feb. 19, 2019

(54) MULTI-ARM DISPLAY ANTI-TOPPLING MECHANISM

(71) Applicant: Myerchin Enterprises, Inc., Bellevue, WA (US)

(72) Inventor: Christian P. Myerchin, Bellevue, WA (US)

(73) Assignee: Myerchin Enterprises, Inc., Bellevue, WA (US)

(*) Notice: Subject to any disclaimer, the term of this patent is extended or adjusted under 35 U.S.C. 154(b) by 0 days.

(21) Appl. No.: 15/163,691

(22) Filed: May 25, 2016

(65) Prior Publication Data

US 2018/0172206 A1 Jun. 21, 2018

(51) Int. Cl.
| | |
|---|---|
| *A47B 97/06* | (2006.01) |
| *F16M 13/02* | (2006.01) |
| *F16M 11/10* | (2006.01) |
| *F16M 11/38* | (2006.01) |
| *G06F 3/041* | (2006.01) |
| *H05K 5/00* | (2006.01) |
| *H05K 5/02* | (2006.01) |
| *A47B 97/00* | (2006.01) |

(52) U.S. Cl.
CPC .......... *F16M 13/022* (2013.01); *F16M 11/10* (2013.01); *F16M 11/38* (2013.01); *F16M 13/02* (2013.01); *G06F 3/0412* (2013.01); *H05K 5/0017* (2013.01); *H05K 5/0226* (2013.01); *H05K 5/0234* (2013.01); *A47B 2097/005* (2013.01); *A47B 2097/008* (2013.01); *F16M 2200/041* (2013.01); *F16M 2200/068* (2013.01)

(58) Field of Classification Search
USPC ........................................ 248/447.2
See application file for complete search history.

(56) References Cited

U.S. PATENT DOCUMENTS

| | | | | |
|---|---|---|---|---|
| 4,836,486 A | * | 6/1989 | Vossoughi ......... | F16M 11/2014 248/280.11 |
| 5,687,939 A | * | 11/1997 | Moscovitch .......... | F16M 11/14 248/122.1 |
| 5,765,797 A | * | 6/1998 | Greene .............. | A47B 21/0314 248/398 |
| 6,430,037 B1 | * | 8/2002 | Oba ...................... | G06F 1/1601 361/679.06 |
| 6,695,270 B1 | * | 2/2004 | Smed ..................... | F16M 11/10 248/274.1 |

(Continued)

*Primary Examiner* — Monica E Millner
(74) *Attorney, Agent, or Firm* — AEON Law, PLLC; Adam L. K. Philipp; David V. H. Cohen (57) ABSTRACT

Adjustable computer touchscreen display mounting device adds an anti-toppling support system to prevent a computer touchscreen display device from toppling despite multiple operating positions. The touchscreen display may be repositioned in a variety of touch modes, which are primarily horizontal, and/or monitor modes, which are primarily vertical. A display base is held close to a desk surface whenever a toppling force is exerted on the display base. One anti-toppling support system pivotally connects anti-toppling arms, one arm being attached to a desk and another arm attached to the display base. In one touch mode, the touchscreen display is extended away from the display base far enough to shift a center of gravity for the combination of display and base outside of the base footprint.

20 Claims, 8 Drawing Sheets

(56) References Cited

U.S. PATENT DOCUMENTS

| | | | | |
|---|---|---|---|---|
| 7,380,760 B2* | 6/2008 | Dittmer | | F16M 11/041 |
| | | | | 248/278.1 |
| 8,102,331 B1* | 1/2012 | Moscovitch | | G09F 9/35 |
| | | | | 248/917 |
| 8,310,468 B2* | 11/2012 | Martin | | F16M 11/10 |
| | | | | 248/274.1 |
| 8,570,723 B2* | 10/2013 | Myerchin | | F16M 11/046 |
| | | | | 248/125.2 |
| 8,576,553 B2* | 11/2013 | Myerchin | | F16M 11/046 |
| | | | | 248/123.2 |
| 8,794,579 B2* | 8/2014 | Sturman | | F16M 11/105 |
| | | | | 248/160 |
| 9,250,650 B2* | 2/2016 | Myerchin | | G06F 1/16 |
| 9,316,346 B2* | 4/2016 | Lau | | F16M 11/126 |
| 9,355,219 B2* | 5/2016 | Paydar | | G06F 19/3462 |
| 2013/0161466 A1* | 6/2013 | Lau | | F16M 13/02 |
| | | | | 248/288.11 |
| 2014/0319293 A1* | 10/2014 | Myerchin | | G06F 1/1601 |
| | | | | 248/123.2 |
| 2014/0366323 A1* | 12/2014 | Brown | | F16M 11/04 |
| | | | | 16/322 |

* cited by examiner

MULTI-ARM DISPLAY ANTI-TOPPLING MECHANISM

FIELD

The present disclosure relates generally to adjustable computer display mounting devices for flat panel displays, such as touch screen displays and/or liquid crystal display (LCD) screens. More particularly, but not exclusively, to multi-position anti-toppling support systems, apparatus, and methods for displays where one end of pivotally connected arms is attached to a desk and another end of the pivotally connected arms is attached to a base of a display stand, such that when the display is extended away from the base in a primarily horizontal touch mode the pivotally connected arms prevent the base from toppling by holding the base close to the desk surface.

BACKGROUND

Touch sensitive desktop screen displays often have at least two distinct usage modes. One mode is a monitor mode in which the screen is positioned in a primarily vertical orientation relative to the desktop surface and is held over a display base. The second mode is a touch mode, which is optimized for touch screen usage where the display is extended out from the display base and the screen is positioned in a primarily horizontal orientation relative to the desk surface. Traditionally, a user is forced to decide which one of these two orientations, primarily vertical or primarily horizontal, to position the screen. Whenever the screen is moved from the monitor mode (primarily vertical) to the touch mode (primarily horizontal), center of mass for the device often extends past the edge of the display base. This creates a toppling condition where the display base will tip if not secured.

Several methods to prevent display screens from toppling are currently available, many use straps or braces to secure the display from toppling. While these fixed methods appear to be effective at controlling toppling, they make moving the display around the desktop difficult. Unfortunately, as users often have different individual ergonomic needs, the ability to move the display is significant.

Accordingly, other display mounting support methods try to provide some movement, over that available when just straps or braces are used, by using horizontally articulating arms instead so that the weight of the display is being fully supported by the articulating arms. This approach requires that the arms be strong enough to support the full weight of the display assembly. However, in configurations using articulating arms to support the full weight of the monitor, whenever a display is extended from monitor mode (primarily vertical) to the touch mode (primarily horizontal), the center of mass for the display moves far beyond the end of the articulating display arm.

In sum, heretofore-known multi-mode touchscreen display positioning systems, apparatus, and methods often secure a display from toppling, but are either relatively immovable once secured and/or are unstable when the display is overextended. Additionally, another difficulty with known multi-mode touchscreen display positioning systems, apparatus, and methods built to support the weight of the monitor is that the touchscreen display is instable and is too easily moved along the horizontal plane. This instability results in a shaky touchscreen monitor and ultimately results in a bad user experience in the touch mode and whenever transitioning between touch mode to monitor mode.

BRIEF DESCRIPTION OF THE DRAWINGS

The various aspects of the present disclosure are best understood from the detailed description when read in relation to the accompanying drawings. The drawings illustrate a variety of different aspects, features, and embodiments of the disclosure, as such it is understood that the illustrated embodiments are merely representative and not exhaustive in scope. The disclosure will now be described with reference to the accompanying drawings, wherein like numbers refer to like elements.

DETAILED DESCRIPTION

As previously explained, there are several problems associated with how large touchscreen displays are currently used. When using the display with a mouse and keyboard, an optimal position is away from the user and in a primarily vertical orientation. When using the display for touch input, an optimal position is lower, in a more horizontal position that is closer to the user. As touchscreen displays are intended to be used in both positions, a user should be able to switch between the different modes almost effortlessly. In accordance with various embodiments of the invention, adjustable touchscreen display positioning anti-toppling systems, apparatus, and methods are described that overcome the hereinafore-mentioned disadvantages of the heretofore-known touchscreen display positioning methods, apparatus and systems of this general type and that transfer any toppling force to a horizontal surface connection point. Additionally, the described embodiments provide anti-toppling mechanisms to prevent a computer display device from toppling whenever a toppling force is exerted on the display base.

In one embodiment, a multi-position display anti-toppling support system, apparatus, and method attaches one end of pivotally connected arms to a desk and another end of the pivotally connected arms to a base of a display stand. This configuration enables the pivotally connected arms to prevent the base from toppling by holding the base close to the desk surface. Particularly whenever the display is extended away from the base in a touch mode, which positions the display in a primarily horizontal position. To compensate for this overextension, a very long lever arm is often needed for the base of the articulating arms to provide the necessary support. However, when attached to the desk, the multi-position display anti-toppling support system, apparatus, and method no longer requires an extended or lengthy lever arm. Instead, the pivotally connected arms can be adjusted to position the display on the desktop according to the individual ergonomic needs of a user without positional limitations imposed due to potential toppling conditions.

In at least one embodiment, the anti-toppling mechanism includes at least two arms. In one embodiment, one arm is pivotally connected to a desk and another arm is pivotally connected to a display base that can be repositioned on a horizontal surface of the desk. The display base, or feet attached to the display base, provide a support contact to the horizontal surface of the desk. In one embodiment, the display base will be held flat against the desktop by the arms, whenever a toppling force is exerted on the display base, thus transferring the toppling force to the horizontal surface connection point. In one embodiment, all other arm connections are pivotally and/or serially connected to each other. In one embodiment, pivotal connections may use a pin to constrain pivot to horizontal axial rotation.

In the following detailed description, reference is made to the accompanying drawings which form a part hereof wherein like numerals designate like parts throughout, and in which are shown, by way of illustration, specific embodiments in which the disclosure may be practiced. Various aspects of the illustrative embodiments will be described using terms commonly employed by those skilled in the art to convey the substance of their work to others skilled in the art. However, the embodiments described herein may be practiced with only some of the described aspects. For purposes of explanation, specific numbers, materials, and configurations may be set forth to provide a thorough understanding of the illustrative embodiments. However, the embodiments described herein may be practiced without the specific details. In other instances, well-known features are omitted or simplified in order not to obscure the illustrative embodiments. Further, various operations may be described as multiple discrete operations, in turn, in a manner that may be helpful in understanding the embodiments described herein; however, the order of description should not be construed as to imply that these operations are necessarily order dependent. In particular, these operations need not be performed in the order of presentation.

It is to be understood that other embodiments may be utilized and structural or logical changes may be made without departing from the scope of the present disclosure. Therefore, the following detailed description is not to be taken in a limiting sense, and the scope of a portion of the present disclosure is defined by the claims and appended drawings and their equivalents.

Throughout the specification and drawings, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. Reference in the specification to "one embodiment" or "an embodiment" or "other embodiments" means that a particular feature, structure, or characteristic described in connection with the embodiment is included in at least one embodiment of the disclosure, but are not necessarily included on all embodiments of the disclosure. The meaning of "in" may include "in" and "on." The phrases "in one embodiment" or "in an embodiment" or "in various embodiments" or "in some embodiments" and the like are used repeatedly. Such phrases in various places in the specification do not necessarily all refer to the same embodiment, but it may unless the context dictates otherwise. For the purposes of this disclosure and the claims that follow, the terms "coupled" and "connected" have been used to describe how various elements interface. The terms "connected" or "coupled" can mean a direct connection between items, an indirect connection through one or more intermediaries, or in a manner that may not constitute a direct mechanical, systematic, physical, or other connection between the items connected. The term "desk" as used herein can mean a piece of furniture. However, the term "desk" may also apply to tables, countertops or any other substantially horizontal surface capable of holding the display assembly. The terms "repositionable", "changeable", and "adjustable" as used herein are considered synonymous and interchangeable, unless the context clearly dictates otherwise, and commonly reference movement and/or changing position of the display and/or display base. The terms "substantially horizontal" and "substantially vertical" as used herein are inter-related terms and may include surfaces which are substantially normal to each other. It should also be noted that although a pure horizontal surface is often preferred as a desktop surface, a slanted horizontal surface may also be used as a desktop surface. Thus, the term "substantially" as used within "substantially horizontal" in this description is largely intended to encompass all desirable work surface angles for touch sensitive display screens. Additionally, the term "substantially" as used within "substantially vertical" in this description is largely intended to encompass all desirable display surface angles for a display screen. Clearly, these "substantially horizontal" and "substantially vertical" planes may be adjusted in accordance with the individual ergonomic needs of a user.

Reference is now made in detail to the description of the embodiments as illustrated in the drawings. Particular embodiments described in this application provide specific case implementations of adjustable multi-arm display positioning anti-toppling systems, apparatus and methods. While embodiments are described in connection with the drawings and related descriptions, there is no intent to limit the scope to the embodiments disclosed herein. On the contrary, the intent is to cover all alternatives, modifications, and equivalents. In alternate embodiments, additional devices, or combinations of illustrated devices, may be added to, or combined, without limiting the scope to the embodiments disclosed herein.

Figure 1:
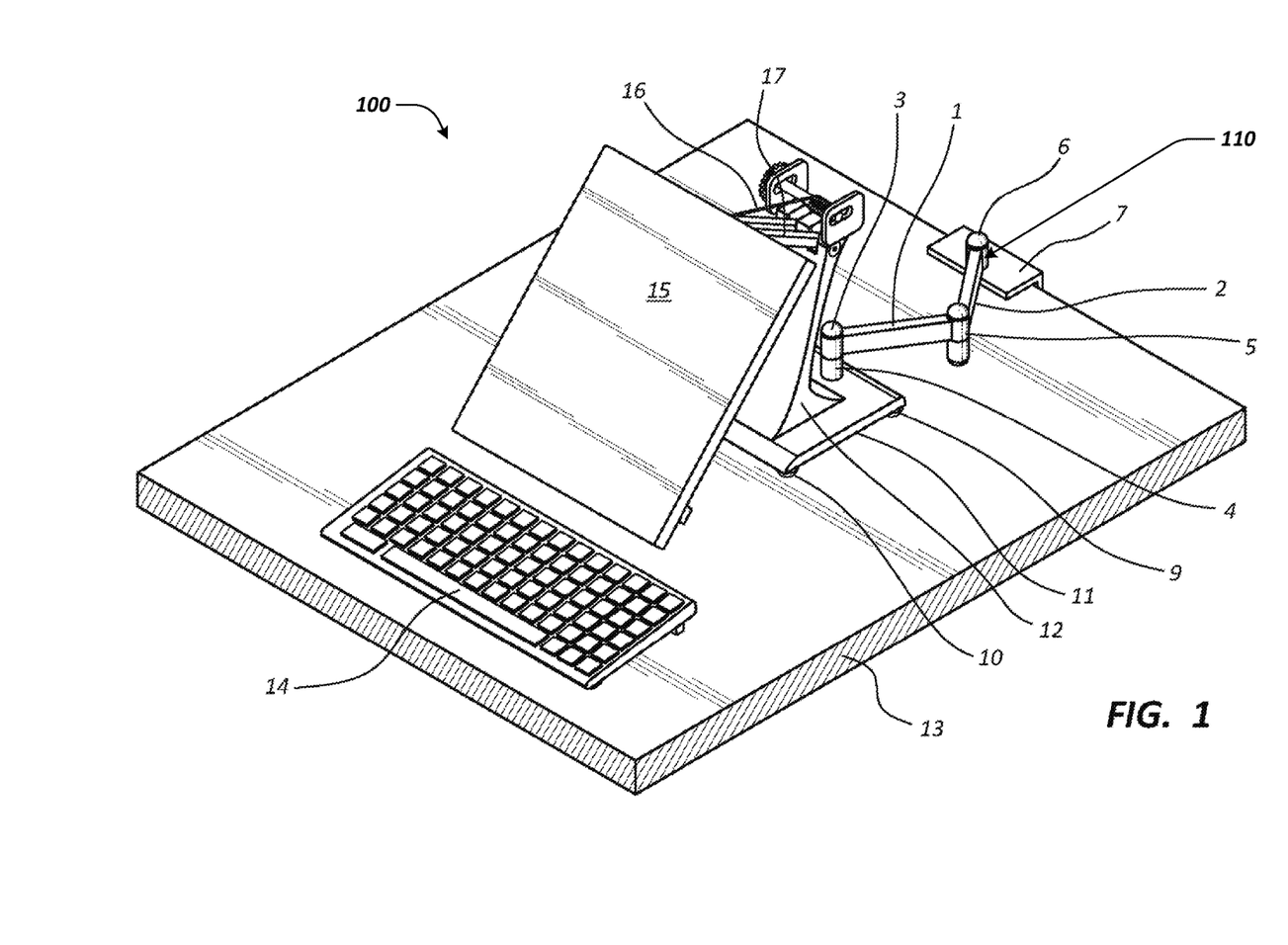
FIG. 1 illustrates a multi-arm display anti-toppling mechanism and desktop display environment in accordance with at least one embodiment.
Figure 2:
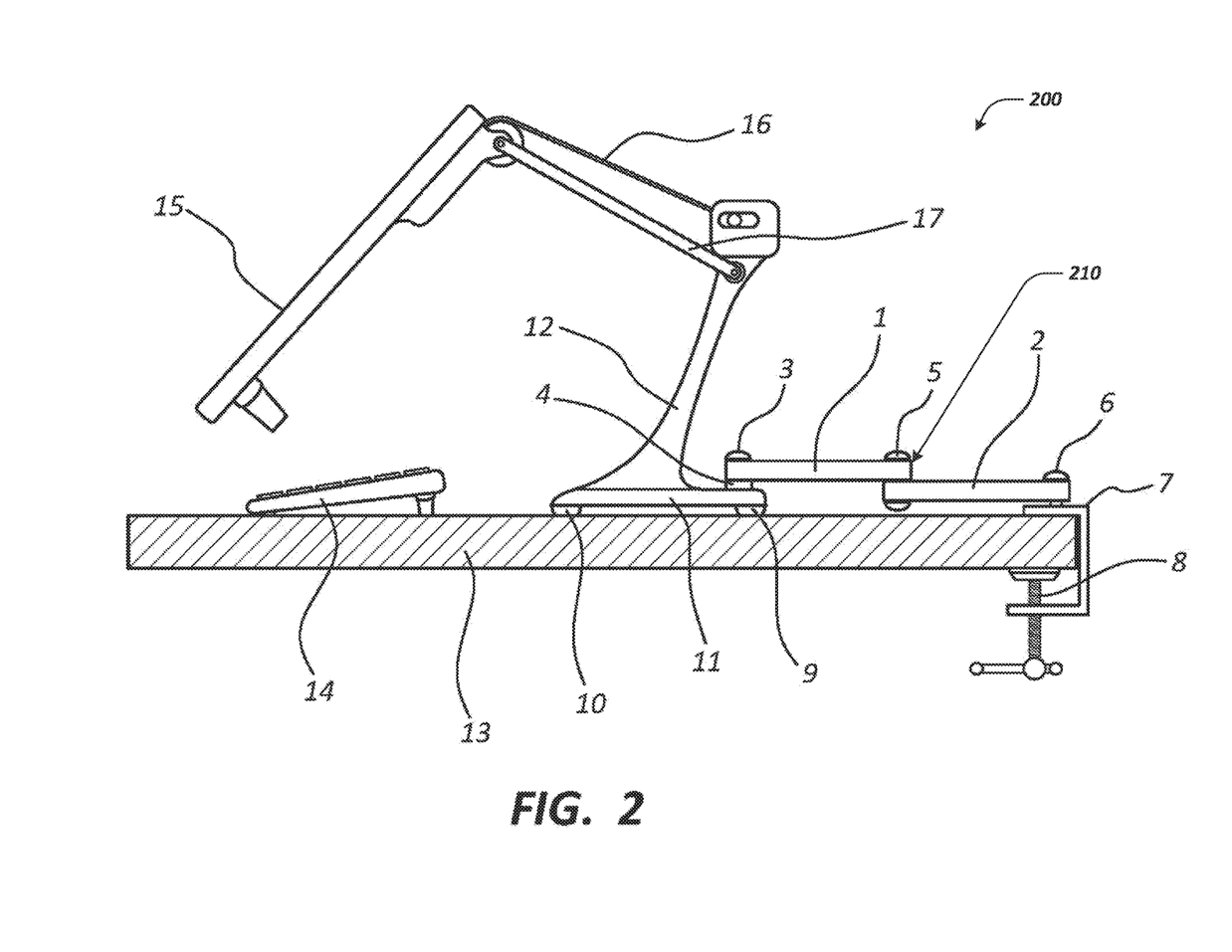
FIG. 2 illustrates a side view of the multi-arm display anti-toppling mechanism, shown previously in FIG. 1, positioning a computer display in an extended touch mode and clamped to a desk in accordance with one embodiment.

Referring to FIG. 1, a desktop display environment 100 is shown that includes a keyboard 14, a display 15 attached to a multi-arm display anti-toppling mechanism 110 mounted to a desk 13 in accordance with at least one embodiment. FIG. 2 provides a side view of a desktop display environment 200 with the multi-arm display anti-toppling mechanism 110 configured in accordance with one embodiment.

As shown in FIG. 1 and FIG. 2, clamp housing 7 and clamp screw assembly 8 are compressively attached to desk 13. The clamp screw assembly 8 includes a screw portion that is threaded through one end of the clamp housing 7 and a head that may be rotated to use the screw as a threaded fastener to the desk. In one embodiment, the clamp screw assembly 8 includes a foot and can be vertically adjusted according to the thickness of the desk 13. Pin assembly 6 is rigidly attached to clamp housing 7. Pin assembly 6 passes through desk arm 2 and allows for a pivotal connection. Pin assembly 6 is capped to prevent desk arm 2 from lifting away from clamp housing 7. Pin assembly 5 passes though both base arm 1 and desk arm 2 and allows for a pivotal connection. Pin assembly 5 is capped on both ends to prevent base arm 1 and desk arm 2 from separating. Pin assembly 3 passes through base arm 1, bushing 4 and attaches to display base 11 and allows for a pivotal connection. Pin assembly 3 allows downward vertical movement of display base 11 toward desk 13. In one embodiment, the pin assemblies 3, 5 and 6 are made of a solid steel shaft. In other embodiments, the pin may be a hollow aluminum shaft, hardened plastic, or any other material capable producing a pin that constrains the pivot of the arms to horizontal axial rotation. In one embodiment the pin assemblies 3, 5 and 6 are made of separate pieces, often from a material different than used in the arms (1 and 2), display base 11 and or clamp housing 7. In other embodiments, the pin may be formed as an appendage of an adjustable body. For example, if an arm were a metal cylinder with a 90-degree bend on one end the bent end could be used as a pin to an adjacent member. In one embodiment the pin assemblies 3, 5 and 6 are in direct contact with arms 1 and 2, display base 11 and/or clamp housing 7. In other embodiments, bushings and/or bearings may be used to provide indirect contact between pins and adjacent members. In one embodiment the pin assemblies 3, 5 and 6 are capped with a nut to prevent the pin from vertically slipping out of the assembly. In other embodiments, the pin may be press fitted to an adjacent member or held by snap ring or other means that prevent the pin from vertically sliding out of place.

Display base 11 is attached to feet 10 and 9. The display support 12 is rigidly attached to the display base 11. In one embodiment, display support 12 and display base 11 are two separate pieces. However, in other embodiments, display support 12 and display base 11 may be formed as a single unit. Display support 12 is pivotally attached to display arm 17 and cable 16. Display arm 17 is pivotally attached to display 15. In one embodiment, display 15 includes a flat display panel connected to a display support frame, suitable for receiving a flat display panel, that is attached to the display arm 17. Display cable 16 is attached to display 15 such that the tilt of the display 15 is effected by the movement of display arm 17.

In one embodiment, the display cable 16 includes a cam based rotation of the touchscreen display 15. More specifically, a cam is wrapped by at least one display cable 16. The cam also attaches to the touchscreen display. A display arm 17 is attached the center of the cam. When the display arm 17 drops downward the at least one display cable 16 pulls on the side of the cam and unwinds the cam. This unwinding changes the tilt of the cam and thereby also changes the tilt of a display. The described cam based rotation method allows for the control of screen torque by defining the radius of the cam at the point of belt contact. This torque control is critical for weightless operation. Despite the advantages provided by the cam based rotation, it should be noted that other acceptable methods may also be used to rotate the touchscreen display between monitor mode and touch mode.

In one embodiment, desk 13 refers to a piece of furniture. However, the term desk may also apply to tables, countertops or any other horizontal work surfaces capable of holding the display assembly.

In one embodiment, the clamp housing 7 and clamp screw assembly 8 are compressively attached to desk 13. Alternatively, the clamp housing 7 may attach to the desk 13 via spring compression, snug fitted housing, glued or attached in any another way so as to create a rigid connection between the camp housing 7 and the desk 13.

In one embodiment, only two arms, base arm 1 and desk arm 2, which are used to connect clamp housing 7 with display base 11. However, in other embodiments, it is possible to serially connect a larger number of intermediary arms to attach the two points, the display base and the desk. In one embodiment, each arm is interchangeable with other arms. For example, in different configurations, a base arm 1 might be used as a desk arm 2 and/or a desk arm 2 may be used as a base arm 1 and/or an intermediary arm could be used as either a base arm 1 and/or a desk arm 2. Using several arms gives a greater range of mobility to the display base 11 on the desk 13.

In one embodiment, pin assembly 6 constrains the pivotal connection to arm 2 along the horizontal plane. However, in other embodiments, the attachment need not be rigid. For example, the attachment may use a ball joint, cable connection, or other similar flexible connection between arm 2 and clamp housing 7. Use of a flexible connection, such as the described multi-axial connection, allows the display base 11 to be lifted from the desk 13, but still prevents the display base 11 from toppling toward the direction of the display 15 provided that all other pivotal connections in the pivoting arm assembly use a pin to constrain the range of the pivot to horizontal axial rotation. Similarly, pin assembly 5 could be replaced by a flexible connection and achieve a similar result provided that all other pivotal connections in the pivoting arm assembly use a pin to constrain the range of pivot to horizontal axial rotation.

The illustrated base 11 includes two front feet 10 and two rear feet 9. However, other embodiments may include additional feet or even fewer feet than shown in FIGS. 1-2. For example, FIGS. 5-8 illustrate an alternative embodiment, where the base has only two feet. In one embodiment feet 9 and 10 are made of felt. However, polyethylene or Teflon® or similarly durable but low friction material could be used. In one embodiment, feet 9 and 10 are allowed to slide over desk 13. Doing so moves display base 11 about the desk 13 surface and articulates the pin assemblies 3, 5, and 6 and arms 1 and 2. In one embodiment, shown in FIG. 2, feet 9 and feet 10 support display base 11. In other embodiments it is possible to exclude a foot or feet, such as feet 9, from the design such that the display base 11 is supported by a single foot or front feet 10 and clamp housing 7 provided that pin assemblies 3 and 5 only allow horizontal axial rotation and do not allow for vertical travel.

In one embodiment, display support 12 is rigidly attached to the display base 11. In other embodiments, the display support 12 may be pivotally attached to the display base 11 to further aid in mobility of display 15.

Illustrative operation of certain aspects of the embodiments will now be described with respect to FIG. 1 and FIG. 2. FIG. 1 and FIG. 2 illustrate different views of one embodiment of an anti-toppling arm configuration that is mounted on a desk 13. As illustrated in FIG. 1, feet 9 and 10 are in contact with a surface of desk 13. Whenever display 15 is extended over an edge of display base 11, the center of mass for the entire display assembly can change to be beyond the edge of the display base 11. This over extension will exert a tipping force on display base 11 potentially causing the display base 11 edge opposite the display 15 to rise relative to the desk 13. Fortunately, the combination of pin assemblies 3, 5 and 6, base arm 1 and desk arm 2 and clamp housing 7 and clamp screw assembly 8 provide rigid horizontal plane connection to desk 13. This horizontal plane connection prevents the display base 11 from rising away from desk 13 whenever the toppling force is applied.

In one embodiment, pin assembly 3 has a shaft that can move vertically though base arm 1 allowing display base to contact desk 13. This can create a degree of slack between bushing 4 and base arm 1. The slack can be reduced by tighten the cap of pin assembly 106. However other locations can be adjusted for removing slack from pin assemblies 3, 5 and 6.

In one embodiment the display 15 is extended and rotated via a connection between display arm 17 and cable 16. In other embodiments, display 15 could be extended and rotated by a pivotal connection to two rigid arms or any other method capable orienting the display 15 to both monitor mode and touch mode.

As previously mentioned, FIG. 2 provides a side view of the desktop display environment 200 with a keyboard 14, a display 15, and a multi-arm display anti-toppling mechanism 210 attached to a desk 13 in accordance with one embodiment. Significantly, FIG. 2 shows the multi-arm display anti-toppling mechanism 210 positioning a computer display 15 in an extended touch mode, where the display 15 extends over the keyboard 14. One end of the pivotally connected anti-toppling desk arm 2 being clamped to a desk 13 and the other end of the base arm 1 connected to a display base 11.

Figure 3:
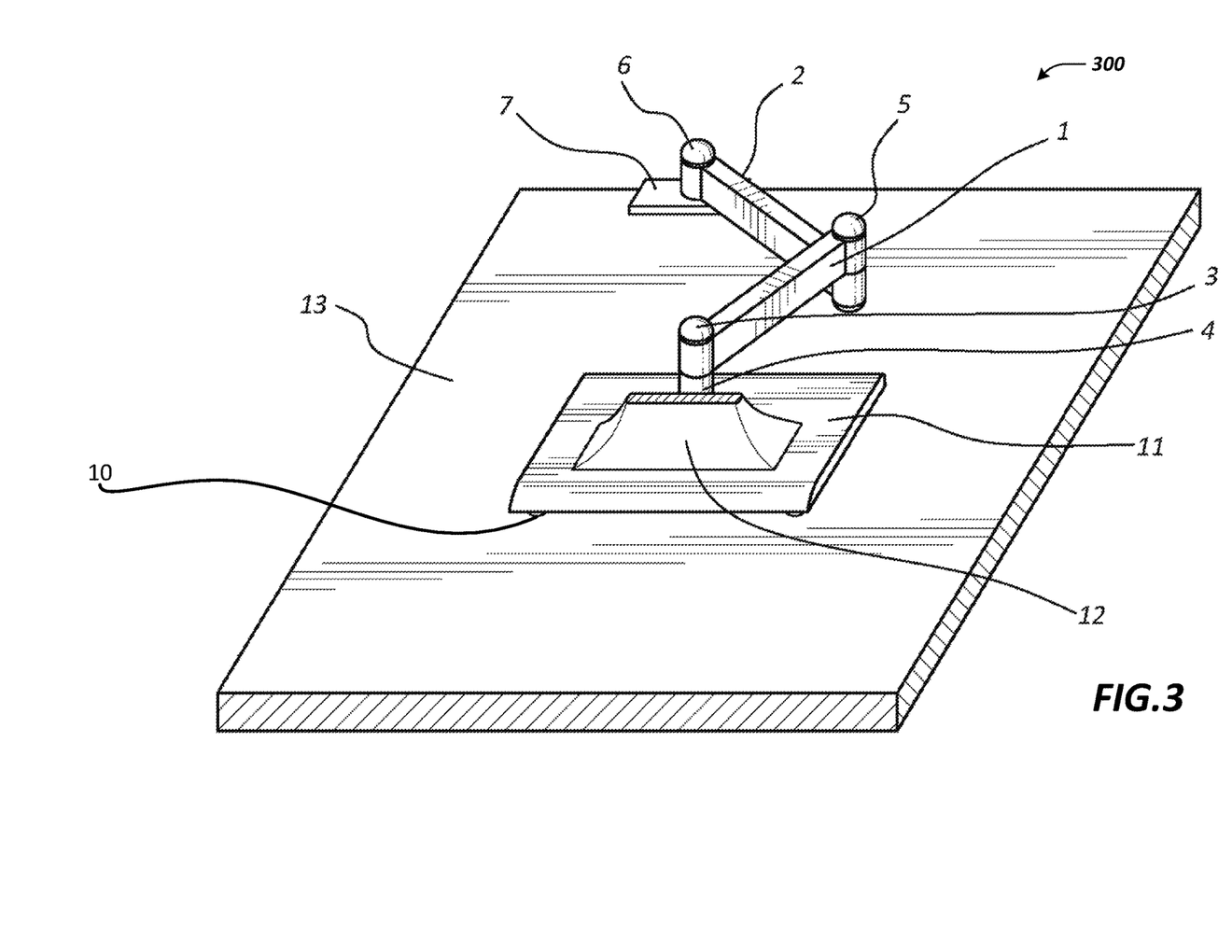
FIG. 3 illustrates a perspective view of pivotally connected anti-toppling arms clamped to a desk and attached to a display base in accordance with one embodiment.

Referring to FIG. 3, the desktop display environment 300 shows several components of the pivotally connected antitoppling arms clamped to a desk 13 and attached to a display base in accordance with one embodiment. In one embodiment, display support 12 is rigidly attached to the display base 11. In other embodiments (see FIGS. 5-8), the display support 12 may be pivotally attached to the display base 11 to further aid in positioning and mobility of display 15.

Figure 4:
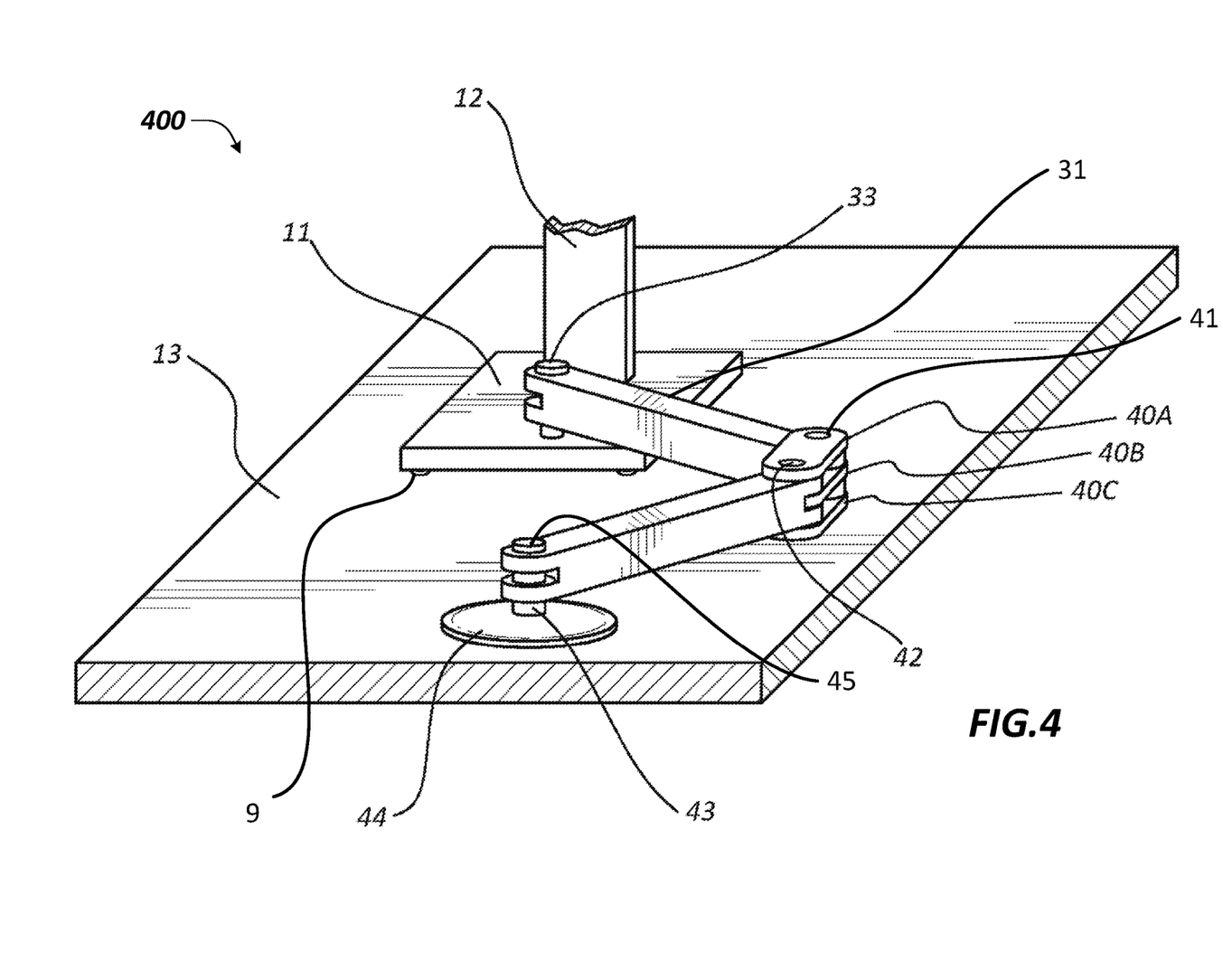
FIG. 4 illustrates a perspective view of anti-toppling arms attached via double hinge assembly to an alternate display base and a desk using a desktop attachment in accordance with one embodiment.

Referring to FIG. 4, the desktop display environment 400 shows anti-toppling arms (31 and 32) attached via a double hinge assembly (40A, 40B, 40C, 41, 42) to a display base 11 and an alternate desk attachment 44 in accordance with at least one embodiment. Pin assembly 45 passes through desk arm 32, bushing 43, desk plate 44, and desk 13 to form a pivotal connection. Pin assembly 45 is capped on both ends to prevent desk arm 32 from lifting away from desk 13. Pin assembly 42 passes through hinge plates 40A, 40B and 40C and desk arm 32 to form a pivotal connection. Pin assembly 42 is capped on both ends to prevent hinge plates 40A, 40B and 40C from separating with desk arm 32. Pin assembly 41 passes through hinge plates 40A, 40B and 40C and base arm 31 to form a pivotal connection. Pin assembly 41 is capped on both ends to prevent hinge plates 40A, 40B and 40C from separating with base arm 31. Hinge plates 40A, 40B and 40C are sufficiently long to allow desk arm 32 to be horizontally parallel with base arm 31. This configuration can reduce space between arms (31 and 32) when the display is positioned properly so that the arms can stack next to each other. Pin assembly 33 passes through base arm 31 and attaches to display base 11 and allows for a pivotal connection. Pin assembly 33 is capped to prevent arm 31 from lifting away from display base 11. The double hinge mechanism (40A, 40B, 40C, 41, 42) allows both arms 31 and 32 to operate in the same horizontal plane. This provides an easy cable routing path for wires such as power or data wires on top of or below arms 31 and 32. In one embodiment, the height of bushing 43 is selectively designed to ensure that display base 11 is in contact with desk 13 with or without intermediate feet to contact desk 13. In one embodiment, pin assembly 45 passes through desk 13. In other embodiments, pin assembly 45 could attach to desk plate 44. In various embodiments, desk plate 44 could attach to desk 13 via adhesion, screws, or other means to create a rigid connection. In one embodiment, the three hinge plates 40A, 40B and 40C are used to connect arms 31 and 32. In other embodiments, the number of hinge plates to form a pivotal connection can be varied. Additionally, at least one other arm could be used to separate and pivotally connect arms 31 and 32 from each other.

Figure 5:
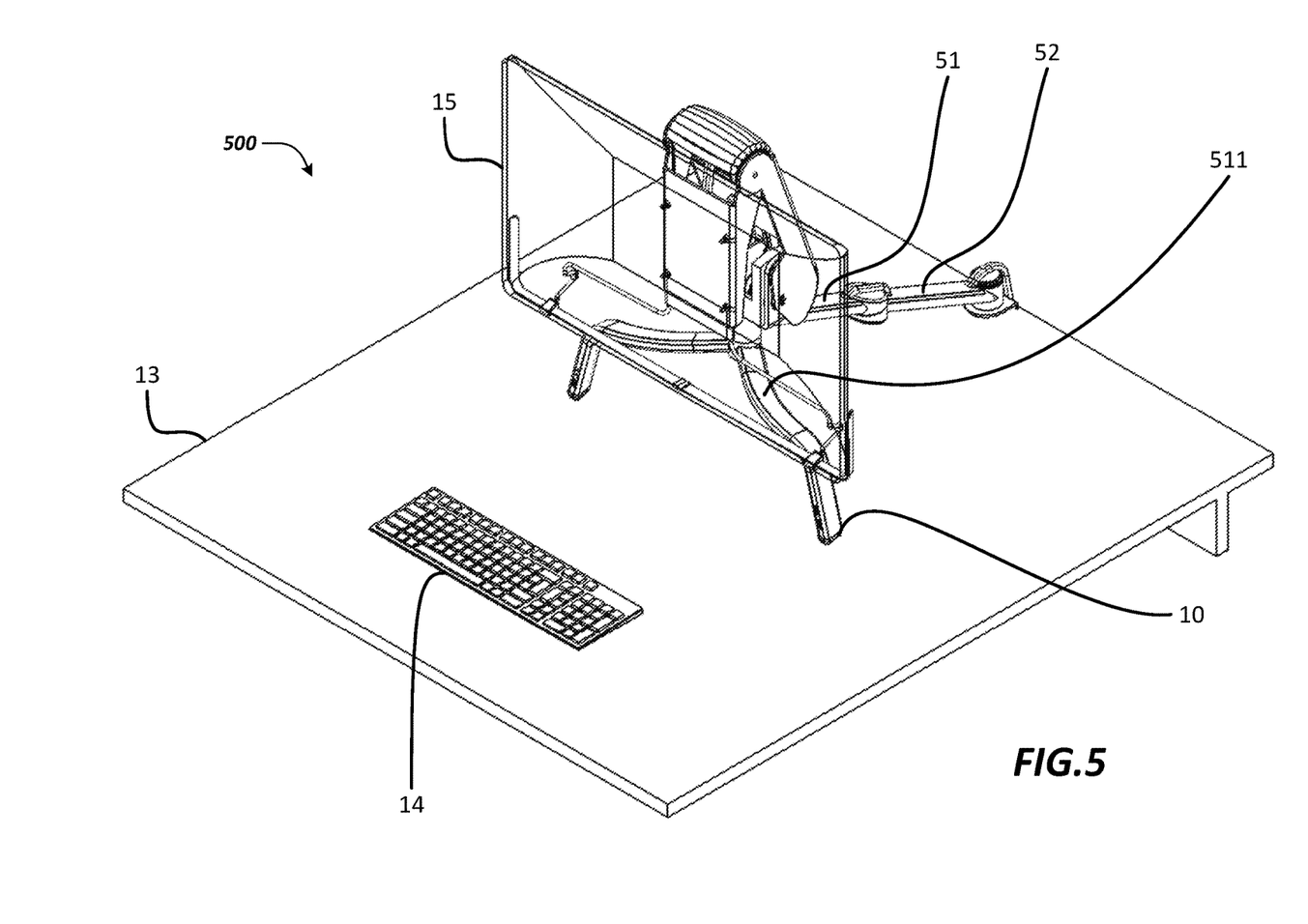
FIG. 5 illustrates a perspective view of a display base supporting a display in monitor mode (primarily vertical) and pivotally connected to anti-toppling arms clamped to a desk in accordance with one embodiment.

Referring to FIG. 5, the desktop display environment 500 shows a display base 511 supporting a display 15 in monitor mode (primarily vertical) and pivotally connected to antitoppling arms (51 and 52) clamped to a desk 13 in accordance with one embodiment. In one embodiment, pin assembly allows the downward vertical movement of display base 511 toward desk 13. In other embodiments, the downward only vertical behavior may be exhibited at other pivot points or locations so that the display base 511 or feet 10 can contact the desk 13 and support some or all of the weight of display 15.

The ergonomics of monitor placement with a mouse and keyboard has been widely studied. More specifically, traditional ergonomics recommends that the display surface be located roughly an arm's length away and the top the display be at or slightly below eye level. When positioning a display in monitor mode, viewing distances that are too long may cause a user to lean forward and eyestrain to see small text. Overtime, this improper positioning can fatigue the eyes and place stress on the torso because the backrest is no longer providing proper support. However, a user must also be careful about positioning a display too close. Viewing distances that are too short may cause eyes to work harder to focus (convergence problems) and may influence a user to sit in awkward postures. For instance, a user may tilt their head backward or push their chair away from the touchscreen display, so that the user is typing with outstretched arms. In addition to these depth placement guidelines, vertical guidelines are also customized to a user. Specifically, the top of the touchscreen display should be at or slightly below eye level of the user. This typically places the center of the touchscreen display between about 15 to 20 degrees below horizontal eye level. However, even these guidelines should be adjusted for the ergonomic needs of each individual user. For example, in one embodiment, greater variability in display placement is available. Thus, for users with vision problems, the placing of the touchscreen lower, closer and angled can be easily accomplished.

Due to the offsetting support from the display base 511 provided by display cables and display arm, the display 15 may appear to move weightlessly. As a result, a user can adjust the touchscreen display position with a light touch using a single finger. Once a desired position is reached, one embodiment uses a capacitive touch sensitive braking system to instantly lock the display in the desired position.

Figure 6:
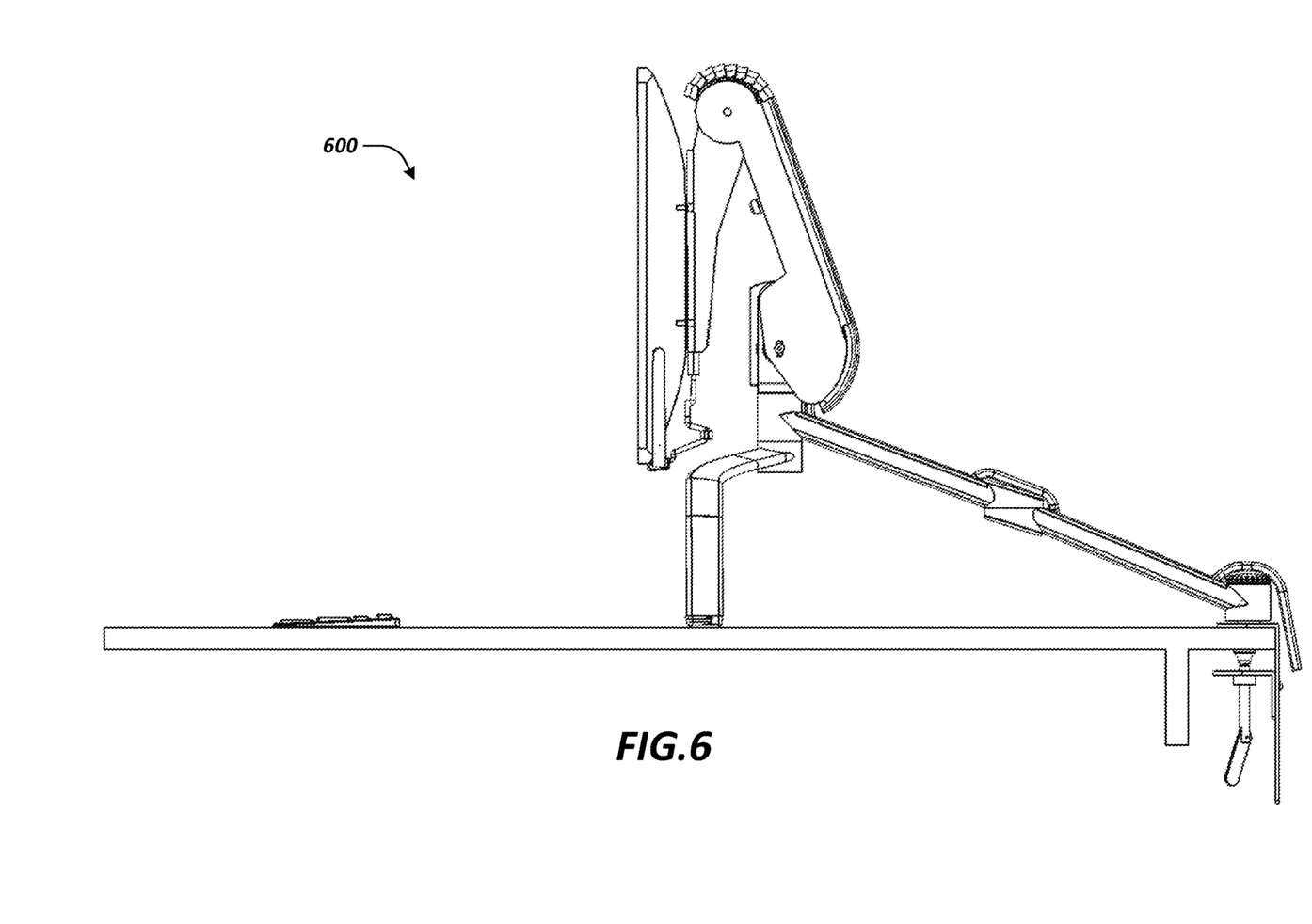
FIG. 6 illustrates a side view of the display base, shown previously in FIG. 5, supporting the display in monitor mode (primarily vertical) and pivotally connected to anti-toppling arms clamped to a desk in accordance with one embodiment.

Referring to FIG. 6, the desktop display environment 600 illustrates a side view of the display base, shown previously in FIG. 5, supporting the display in monitor mode (primarily vertical) and pivotally connected to anti-toppling arms clamped to a desk in accordance with one embodiment. In monitor mode, the screen is vertical and distant from the user. In one embodiment, the transition between touch mode and monitor mode may move the edge of the display up to about 40 cm without adjusting the position of the base.

Figure 7:
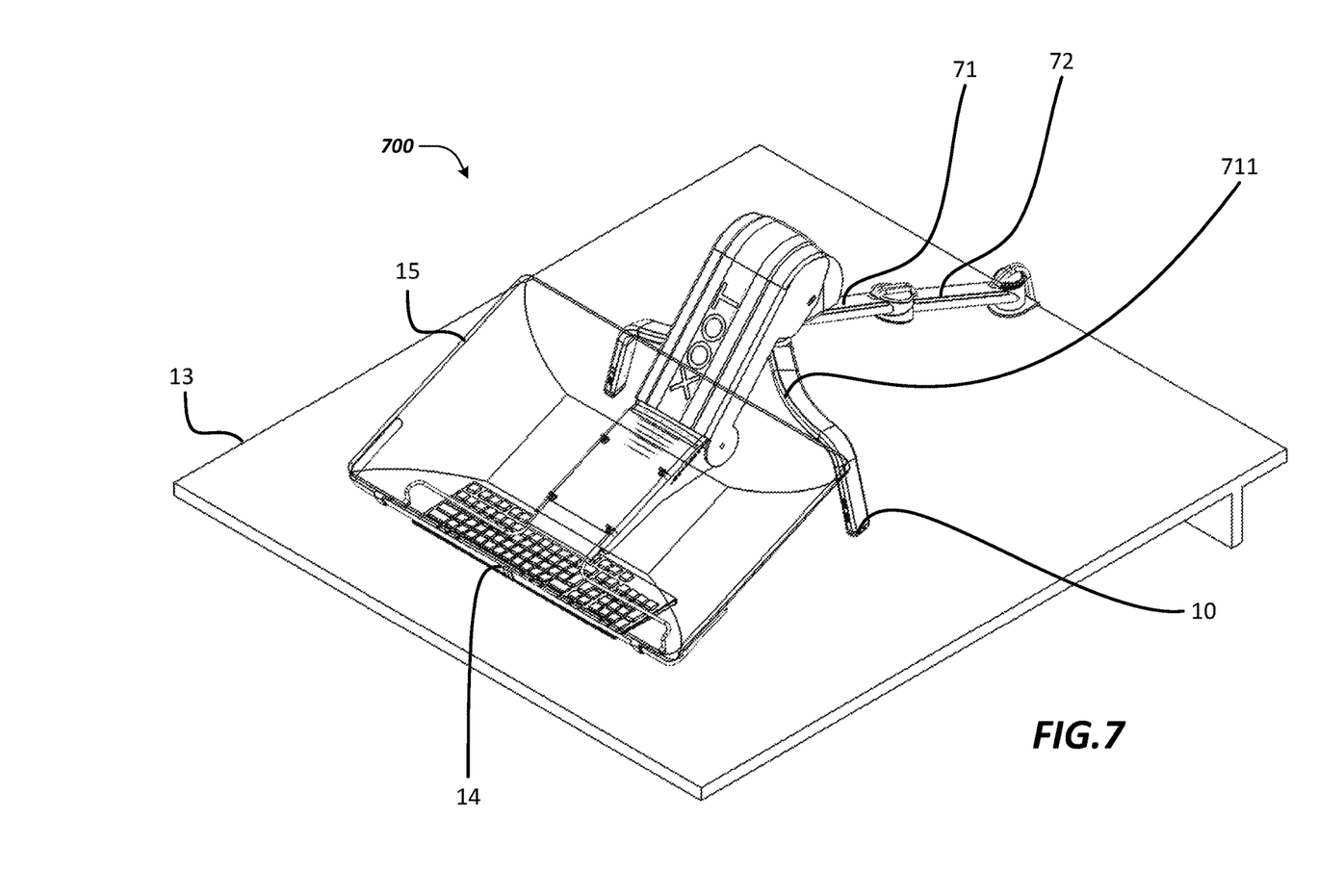
FIG. 7 illustrates a perspective view of a display base supporting a display in touch mode (primarily horizontal) and pivotally connected to anti-toppling arms clamped to a desk in accordance with one embodiment.
Figure 8:
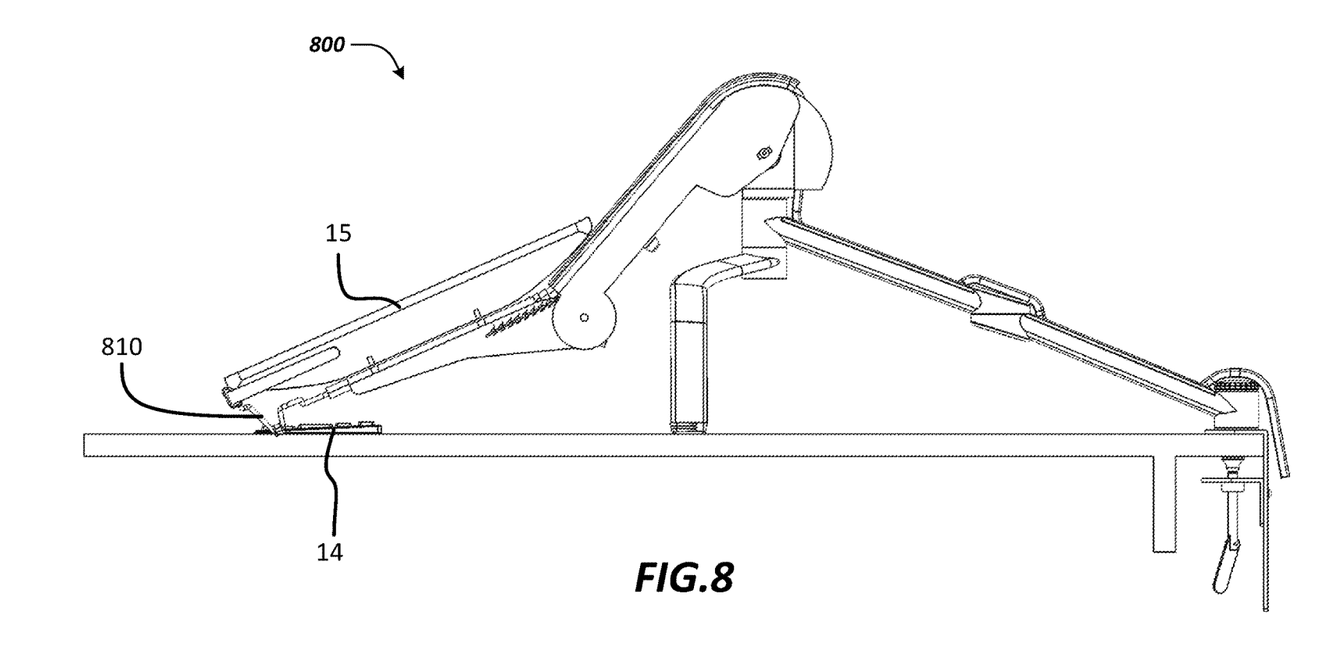
FIG. 8 illustrates a side view of the display base, shown previously in FIG. 7, supporting the display in touch mode (primarily horizontal) and pivotally connected to anti-toppling arms clamped to a desk in accordance with one embodiment.

Referring to FIG. 7, the desktop display environment 700 illustrates a perspective view of a display base 711 supporting a display 15 in touch mode (primarily horizontal) and pivotally connected to anti-toppling arms (71 and 72) clamped to a desk in accordance with one embodiment. FIG. 8 illustrates a side view of the desktop display environment 800 including the display base, shown previously in FIG. 7, supporting the display in touch mode (primarily horizontal) and pivotally connected to anti-toppling arms clamped to a desk in accordance with one embodiment. As can be seen in FIG. 8, in touch mode, the touchscreen display 15 may sit just above the mouse and keyboard 14. Unlike other touch solutions that require both to be moved out the way. In one embodiment, secondary feet are positioned behind the touchscreen display. These secondary feet 810 extend down from back edges of the monitor and contact the desk. These feet keep the touchscreen display very stable for touch mode operation and positions the touch screen above any keyboard or mouse located below on the desk. When the display is cantilevered over the keyboard, the display's base would topple over if not for a set of scissoring arms that connect the display base with the desk. The arms also allow the display base to easily be moved around the desk.

In touch mode (primarily horizontal), touchscreen ergonomics has been less studied than classic computer monitor usage. Thus there are less decisive ergonomic guidelines. Still in touch mode, the touchscreen display should be relatively close to the user, generally were the keyboard normally is, with the screen of the display tilted between about 18 to about 32 degrees. In one embodiment, the touchscreen display is within 14" of the user in touch mode. In other embodiments, the touchscreen display is positioned within 24" of the user. In one embodiment, the touchscreen display may also be pulled past the edge of the desk. This allows a user to lean back in their chair and comfortably operate the touchscreen in a more casual touch mode.

Although specific embodiments have been illustrated and described herein, a whole variety of alternate and/or equivalent implementations may be substituted for the specific embodiments shown and described without departing from the scope of the present disclosure. Thus, although the subject matter has been described in language specific to structural features and/or methodological acts, it is also to be understood that the subject matter defined in the appended claims is not necessarily limited to the specific features or acts described. Rather, the specific features and acts are disclosed as example forms of implementing the claims. This application is intended to cover any adaptations or variations of the embodiments discussed herein.

The invention claimed is:

1. An adjustable display positioning anti-toppling mechanism comprising:
    a repositionable display base on a horizontal surface of a desk; and
    at least two pivotally connected anti-toppling arms including a base arm attached to the repositionable display base and a desk arm selectively securable to the desk, wherein the at least two pivotally connected anti-toppling arms are configured to keep the repositionable display base in contact with the horizontal surface of the desk, transferring toppling forces from the base to the desk.

2. The apparatus as recited in claim 1, wherein the at least two pivotally connected anti-toppling arms include at least one flexible connection.

3. The apparatus as recited in claim 2, wherein remaining connections of the at least two pivotally connected anti-toppling arms use a pin to constrain the range of pivoting to horizontal axial rotation.

4. The apparatus as recited in claim 1, wherein the selectively securable portion of the at least two pivotally connected anti-toppling arms includes a clamp to compressively attach to the desk, the clamp having a clamp housing and a clamp screw assembly, the clamp screw assembly is threaded through one end of the clamp housing and includes a head that may be rotated to use the screw as a threaded fastener, the clamp housing also pivotally coupled to the desk arm via a desk pin assembly, the desk pin assembly being rigidly attached to the clamp housing and passing through the desk arm thereby creating a pivot connection.

5. The apparatus as recited in claim 1, wherein the repositionable display base includes at least two feet to provide a weight bearing support for a touchscreen display.

6. The apparatus as recited in claim 1, wherein the at least two pivotally connected anti-toppling arms are interchangeable.

7. A desktop anti-toppling system for securing an adjustable display positioning support stand to a desk, comprising:
    a repositionable display having at least a monitor mode where a screen of the repositionable display is positioned in a primarily vertical orientation relative to a desktop surface of the desk and a touch mode where the screen is positioned in a primarily horizontal orientation relative to the desk surface;
    a display base supporting and attached to the repositionable display, the display base in contact with and repositionable across a work surface of the desk; and
    pivotally connected anti-toppling arms, one arm attached to the display base and another arm selectively securable to the desk;
    wherein the pivotally connected anti-toppling arms are configured to keep the repositionable display base in contact with the work surface of the desk, transferring toppling forces from the base to the desk.

8. The system as recited in claim 7, wherein a center of mass in the touch mode for the repositionable display and the display base extends past an edge of the display base.

9. The system as recited in claim 8, wherein a center of mass in the monitor mode for the repositionable display and display base remains within an edge of the display base.

10. The system as recited in claim 8, wherein the pivotally connected anti-toppling arms prevent the base from toppling by holding the base close to a work surface of the desk whenever the display is extended away from the base in the primarily horizontal touch mode.

11. The system as recited in claim 7, wherein each end of a pivotally connected anti-toppling arm is vertically dissimilar from the other end of the pivotally connected anti-toppling arm so that the pivotally connected anti-toppling arms may be stacked vertically.

12. The system as recited in claim 7, wherein the pivotally connected anti-toppling arms are attached via a double hinge assembly and the pivotally connected anti-toppling arms may be stacked horizontally parallel.

13. The system as recited in claim 7, wherein the pivotally connected anti-toppling arms include a pin to constrain the range of pivoting to horizontal axial rotation.

14. An anti-toppling method for securing an adjustable display positioning support stand to a desk, comprising:

anchoring, by pivotally connected anti-toppling arms, one arm to the desk;

attaching, by pivotally connected anti-toppling arms, another arm to a display base, wherein the display base is on the desk; and positioning, by the display base, a repositionable display on a work surface of the desk, the repositionable display having a touch mode position where a screen of the display is positioned in a primarily horizontal orientation relative to a desk surface of the desk and a center of mass for a combination of the repositionable display and the display base extends past an edge of the display base;

wherein the positioning the repositionable display on the work surface of the desk comprises holding the display base in contact with the work surface of the desk, by the pivotally connected anti-toppling arms, such that toppling forces are transferred from the base to the desk.

15. The method recited in claim 14, further comprising repositioning the display base on the desk surface.

16. The method recited in claim 14, wherein the pivotally connected anti-toppling arms are attached via a double hinge assembly.

17. The method recited in claim 14, wherein the repositionable display also includes a monitor mode position where a screen of the display is positioned in a primarily vertical orientation relative to a desk surface of the desk.

18. The method recited in claim 17, further comprising switching the repositionable display between the monitor mode and the touch mode without changing the display base and/or the pivotally connected anti-toppling arms to compensate for changes in the center of mass for the combination of the repositionable display and the display base.

19. The method recited in claim 14, wherein the pivotally connected anti-toppling arms are interchangeable.

20. The method recited in claim 19, wherein pivoting for the pivotally connected anti-toppling arms is constrained to horizontal axial rotation.

* * * * *